United States Patent [19]
Hatano

[11] Patent Number: 5,989,345
[45] Date of Patent: Nov. 23, 1999

[54] PROCESS-GAS SUPPLY APPARATUS

[75] Inventor: Tatsuo Hatano, Ryuoshimmachi, Japan

[73] Assignee: Tokyo Electron Limited, Tokyo, Japan

[21] Appl. No.: 09/069,987

[22] Filed: Apr. 30, 1998

[30] Foreign Application Priority Data

May 2, 1997 [JP] Japan .................................. 9-130261

[51] Int. Cl.$^6$ ............................................... C23C 16/00
[52] U.S. Cl. ........................................ 118/715; 156/345
[58] Field of Search .................................. 118/715, 725; 156/345

[56] References Cited

U.S. PATENT DOCUMENTS

| | | | |
|---|---|---|---|
| 5,575,854 | 11/1996 | Jinnouchi et al. | 118/715 |
| 5,584,963 | 12/1996 | Takahashi | 156/646.1 |
| 5,620,524 | 4/1997 | Fan et al. | 118/726 |
| 5,777,300 | 7/1998 | Homma et al. | 219/679 |
| 5,785,796 | 7/1998 | Lee | 156/345 |
| 5,840,368 | 11/1998 | Ohmi | 427/255.4 |

FOREIGN PATENT DOCUMENTS 0 307 995  3/1989  European Pat. Off. .

OTHER PUBLICATIONS

Patent Abstracts of Japan, vol. 15, No. 357 (C–0866), Sep. 10, 1991, JP 3–141192, Jun. 17, 1991.

*Primary Examiner*—Bruce Breneman
*Assistant Examiner*—Erin Fieler
*Attorney, Agent, or Firm*—Oblon, Spivak, McClelland, Maier & Neustadt, P.C.

[57] ABSTRACT

A process-gas supply apparatus for supplying a process gas to a process chamber in which a predetermined processing using the process gas is applied to the object set therein, which comprising a process-gas source for supplying a process gas, a carrier gas source filled with a carrier gas, at least one gas storing section having a predetermined volume and to be filled with the process gas, a carrier-gas introducing pipe connecting the carrier gas source to the process chamber to introduce the carrier gas from the carrier gas source to the process chamber, a process-gas releasing pipe connected to the process-gas source, a process-gas filling circuit having at least one pipe which connects the at least one gas storing section to the process-gas releasing pipe and is provided with at least one open/shut valve, a process gas releasing circuit having at least one pipe which connects the gas storing section to the carrier-gas introducing pipe and is provided with at least one open/shut valve, a controlling section for controlling not only a communication state between the process-gas releasing pipe and the gas storing section but also a communication state between the carrier-gas introducing pipe and the gas storing section, by switchover of the open/shut valves attached to the process-gas filling circuit and the process gas releasing circuit.

12 Claims, 3 Drawing Sheets

PROCESS-GAS SUPPLY APPARATUS

BACKGROUND OF THE INVENTION

The present invention relates to a process-gas supply apparatus for supplying a process gas into a process chamber arranged in a process apparatus such as a semiconductor manufacturing apparatus and having a object to be processed set therein.

Generally, in a manufacturing process of a semiconductor integrated circuit, a film formation process, pattern etching, and the like, are repeatedly applied onto a semiconductor wafer or a glass substrate, thereby obtaining a desired device. Recently, line width and gate width have become narrow associated with a tendency toward miniaturization and high integration of the semiconductor integrated circuit. Also, the film thickness tends to be reduced since the semiconductor integrated circuit is increasingly desired to have a multilevel interconnection structure.

As mentioned above, when the thickness of the formed film is reduced as a result of the high integration and the multi-layer tendency of the integrated circuit, it becomes critical to control a flow amount of a process gas accurately for forming a film. To control the flow amount accurately, a flow-amount controller such as a mass-flow controller is generally used in the semiconductor manufacturing apparatus. However, the mass-controller is not suitable for controlling a small amount of a gas flow for the reason of its structural characteristics. In fact, it is difficult to accurately form a gate electrode and wiring of several hundreds of angstroms in thickness under the control by the mass-flow controller.

BRIEF SUMMARY OF THE INVENTION

An object of the present invention is to provide a process-gas supply apparatus capable of supplying a small amount of the process gas accurately by controlling the flow amount.

The object of the present invention can be achieved by a process-gas supply apparatus for supplying a process gas to a process chamber in which a predetermined processing using the process gas is applied to the object set therein, which comprising:

- a process-gas source for supplying a process gas;
- a carrier gas source filled with a carrier gas;
- at least one gas storing section having a predetermined volume and to be filled with the process gas;
- a carrier-gas introducing pipe connecting the carrier gas source to the process chamber to introduce the carrier gas from the carrier gas source to the process chamber;
- a process-gas releasing pipe connected to the process-gas source;
- a process-gas filling circuit having at least one pipe which connects the at least one gas storing section to the process-gas releasing pipe and is provided with at least one open/shut valve;
- a process gas releasing circuit having at least one pipe which connects the gas storing section to the carrier-gas introducing pipe and is provided with at least one open/shut valve;
- a controlling section for controlling not only a communication state between the process-gas releasing pipe and the gas storing section but also a communication state between the carrier-gas introducing pipe and the gas storing section, by switchover of the open/shut valves attached to the process-gas filling circuit and the process gas releasing circuit, wherein the controlling section allows the process-gas releasing pipe to communicate with the gas storing section to fill the gas storing section with the process gas flowing in the process-gas releasing pipe, in a volume defined by the predetermined content of the gas storing section; and thereafter allows the carrier-gas introducing pipe to communicate with the gas storing section to introduce the carrier gas flowing through the carrier-gas introducing pipe into the gas storing section, thereby releasing the process gas stored in the gas storing section toward a process chamber, under the guidance of the carrier gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Hereinbelow, an embodiment of the present invention will be explained with reference to the accompanying drawings.

Figure 1:
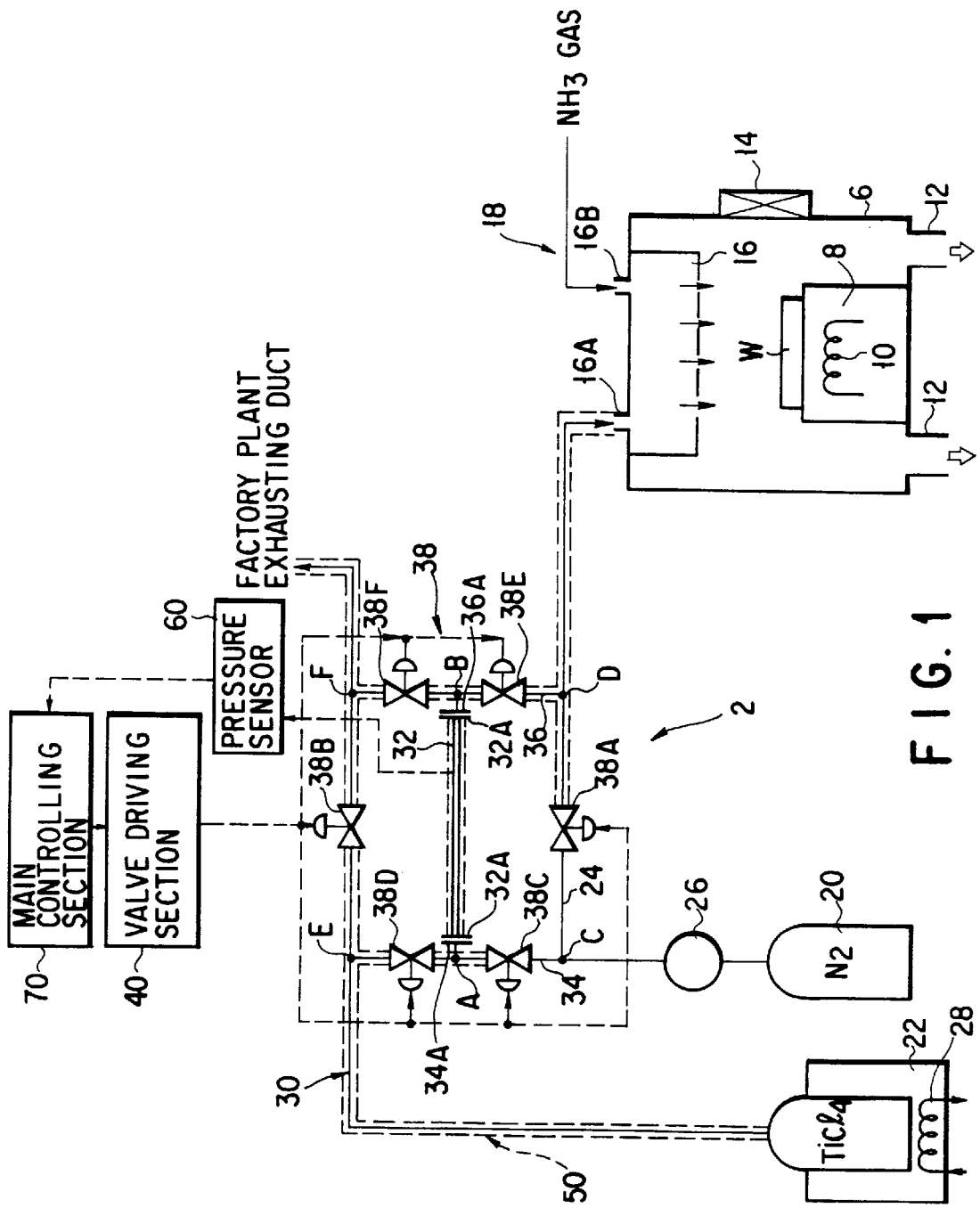
FIG. 1 is a circuit diagram of a circuit constitution of a process-gas supply apparatus according to an embodiment of the present invention.

FIG. 1 shows a process-gas supply apparatus 2 according to an embodiment of the present invention. The process-gas supply apparatus 2 is connected to a process chamber 6, thereby constituting main section of a semiconductor manufacturing apparatus. The process chamber 2 houses a object to be processed (hereinafter, referred to as a "substrate W") such as a semiconductor wafer or an LCD substrate. In the semiconductor manufacturing apparatus of this embodiment, a $TiCl_4$ (titanium tetrachloride gas) gas is supplied as a process gas from the process-gas supply apparatus 2 to the process chamber 6, thereby forming a Ti film on the substrate W set in the process chamber 6.

The process chamber 6 is formed of, for example, aluminium and the inner surface thereof is coated with aluminum oxide. The process chamber 6 has a mounting table (susceptor) 8 therein for mounting the substrate W. The mounting table 8 houses a heating means, such as a resistance heater 10, for heating the substrate W mounted on the mounting table 8 to a predetermined temperature and maintaining it at the predetermined temperature. An exhaust port 12 is formed through the bottom of the process chamber 6 to set the inner pressure of the process chamber 6 at a predetermined vacuum level. The exhaust port 12 is connected to a vacuum pump system (not shown). A gate valve 14 is attached onto the side wall of the process chamber 6. The substrate W is loaded into and out from the process chamber 6 through the gate valve 14.

In the ceiling section of the process chamber 6, a shower head 16 is attached for introducing the gas to be supplied to the process chamber 6 uniformly into the process chamber 6. The shower head 16 has two gas supply port 16A, 16B. One (16B) of the two gas supply port is connected to a gas supply system 18 for supplying a reaction gas such as an $NH_3$ (ammonia) gas required for film formation. The other gas supply port 16A is connected to the process-gas supply apparatus 2.

The process-gas supply apparatus 2 has not only a $N_2$ gas source 20 filled with a $N_2$ gas (serving as a carrier gas) but also a $TiCl_4$ gas source 22 for supplying a $TiCl_4$ gas (serving as a process gas). The $N_2$ gas source 20 is connected to the gas supply port 16A of the shower head 16 by way of a carrier gas path (pipe) 24. A regulator 26 for sending out the $N_2$ gas stored in the $N_2$ gas source 20 at a predetermined pressure is attached to a portion of the carrier gas path 24 positioned in the proximity of the gas exhaust port of the $N_2$ gas source 20. An end of a gas exhaust path (pipe) 30 is connected to the $TiCl_4$ gas source 22 and the other end of the gas exhaust path 30 is connected to an exhaust duct of a factory plant (not shown) which is set at about atmospheric pressure. A temperature controlling mechanism 28 such as a heater is positioned in the periphery of the $TiCl_4$ gas source 22. The temperature controlling mechanism 28 heats a liquid-state $TiCl_4$ ($TiCl_4$ is present in the form of a liquid at room temperature) stored in the $TiCl_4$ gas source 22 at a predetermined temperature, thereby generating the $TiCl_4$ gas. In this way, the $TiCl_4$ gas is sent out from the $TiCl_4$ gas source 22 at a predetermined pressure.

The carrier gas path 24 is connected to the gas exhaust path 30 via two auxiliary tubes 34, 36. The auxiliary tubes 34 and 36 are connected to each other by a measuring tube (gas storing section) 32 whose volume is set at a predetermined value. Flanges 32A, 32A are respectively provided at both ends of the measuring tube 32. These flanges 32A, 32A are connected airtight by means of fixing means such as bolts, to flanges 34A, 36A which are respectively provided at the auxiliary tubes 34, 36.

To control communication of the measuring tube 32 with the carrier gas path 24 and the gas exhaust path 30, a valve mechanism 38 consisting of a plurality of valves is provided on the path 24, 30 and the auxiliary tubes 34, 36. The valve mechanism 38 consists of a first valve 38A attached in the middle of the carrier gas path 24, a second valve 38B attached in the middle of the gas exhaust path 30, third and fourth valves 38C, 38D attached in the middle of the auxiliary tube 34, and fifth and sixth valves 38E, 38F attached in the middle of the auxiliary tube 36. In this case, the first valve 38A is located between a junction C which connects the auxiliary tube 34 to the carrier gas path 24 and a junction D which connects the auxiliary tube 36 to the carrier gas path 24. The second valve 38B is located between a junction E which connects the auxiliary tube 34 to the gas exhaust path 30 and a junction F which connects the auxiliary tube 36 to the gas exhaust path 30.

The third and fourth valves 38C, 38D are respectively located at both sides of a junction A which connects the measuring tube 32 to the auxiliary tube 34. The fifth and sixth valves 38E, 38F are respectively located at both sides of a junction B which connects the measuring tube 32 and the auxiliary tube 36. To reduce a tube volume of the auxiliary tube 34 located between the valves 38C and 38D and to reduce a tube volume of the auxiliary tube 36 located between he valves 38E and 38F as small as possible, the third and fourth valves 38C and 38D are arranged near the junction A and the fifth and sixth valves 38E and 38F are arranged near the junction B. The open/shut control of each of valves 38A–38F is effected by a valve driving section 40 controlled by a main controlling section 70 of the semiconductor manufacturing device.

Figure 2A:
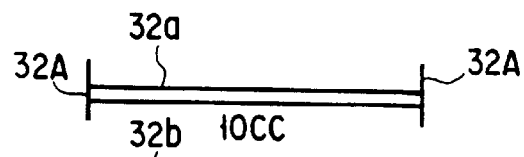
FIG. 2A is a schematic view of a measuring tube of 10 CC.
Figure 2B:
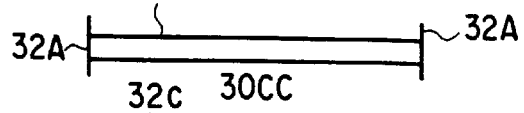
FIG. 2B is a schematic view of a measuring tube of 30 CC.
Figure 2C:
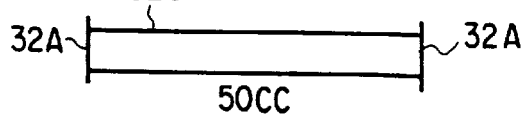
FIG. 2C is a schematic view of a measuring tube of 50 CC.

The measuring tube 32 to be detachably connected between the auxiliary tube 34 and 36 has a predetermined volume (small volume) which is previously set by defining the inner diameter and the length accurately. Various type of measuring tubes 32a–32c different in volume are shown in FIGS. 2A–2C. Volumes of the measuring tubes 32a, 32b, 32c connected between the auxiliary tubes 34 and 36 are set so as to give total volumes of 10 CC, 30 CC, and 50 CC, respectively. The tube volume of the auxiliary tube 34 between the valves 38C and 38D and the tube volume of the auxiliary tube 36 between the valves 38E and 38F must be included in the total volume used herein. In this embodiment, these measuring tubes different in volume are selectively used depending upon the amount of the process gas required at the film-formation time.

Note that a heater 50 (indicated by a broken line) such as a tape heater is attached to the $TiCl_4$ gas flowing portions of paths 24, 30 and the auxiliary tubes 34, 36. The heater 40 plays a role in preventing the $TiCl_4$ gas from condensing to be converted into a liquid in the middle of the paths 24, 30 and the auxiliary tubes 34, 36. Although the six valves 38A to 38F are set in a discrete form in this embodiment, the entire structure may be simplified significantly if use is made of a multiple unit valve having six valves 38A to 38F incorporated therein. The $N_2$ gas is used as a carrier gas herein, however, other inert gas such as an Ar gas and a He gas may be used. The tube volume of the measuring tube 32 is not limited to 10 cc, 30 cc and 50 cc. The inner diameter of the measuring tube 32 and those of the auxiliary tubes 34, 36 may be substantially equal.

Now, we will explain the case in which a Ti film is formed on the substrate W in the process chamber 6 by making use of the process-gas supply apparatus 2 constructed in the above.

When the $TiCl_4$ gas is supplied at a constant pressure, it has been empirically known how thick the film is formed depending upon the flow amount. Prior to the initiating the film formation process, the measuring tube 32 capable of supplying a flow amount corresponding upon a desired film thickness is installed between the auxiliary tubes 34 and 36 of the process-gas supply apparatus 2. For example, provided that 10cc of the $TiCl_4$ gas in flow amount is required for forming the Ti film in a desired thickness of 100 Å under a constant pressure, the measuring tube 32a shown in FIG. 2A is installed between the auxiliary tubes 34 and 36.

After the measuring tube 32 having a predetermined volume (hereinafter, the volume is regarded as 10 cc) is set between the auxiliary tubes 34 and 36, the substrate W is mounted on the mounting table 8 in the process chamber 6 and heated to a predetermined temperature. At this time, the process chamber 6 is vacuumed to set at a predetermined process pressure. In this embodiment, the process temperature is set at 600° C., and the process pressure is set within the range of 10 m Torr to 10 Torr (for example, about 300 m Torr). On the other hand, a $NH_3$ gas serving as a reaction gas is supplied in a predetermined amount from the gas supply system 18 into the process chamber 6.

In this step (the step before the film formation is initiated), the first, fourth and sixth valves, 38A, 38D, 38F are opened, whereas the second, third and fifth valves, 38B, 38C, 38E are closed. Hence, the $N_2$ gas (serving as a carrier gas) supplied from the $N_2$ gas source 20 is controlled by the regulator 26 always at a constant pressure and directly introduced into the process chamber 6 by way of the carrier gas path 24, as indicated by an arrow 42 in FIG. 3. The $TiCl_4$ gas (serving as a process gas) supplied from the $TiCl_4$ gas source 22 is controlled by the temperature controlling mechanism 22 always at a constant pressure, and introduced into the measuring tube 32 by way of the gas exhaust path 30 and the fourth valve 38D, as indicated by an arrow 44 in FIG. 3. Then, the $TiCl_4$ gas is exhausted toward the exhaust duct of a factory plant by way of the sixth valve 38F and the gas exhaust path 30. When the $TiCl_4$ gas flows through the route mentioned, the measuring tube 32 is always filled with a certain amount (i.e., 10 cc) of the $TiCl_4$ gas.

In the process-gas supply apparatus 2, the pressure of both paths 24 and 30 are controlled substantially equal. The $TiCl_4$ gas is generated by heating a liquid-state $TiCl_4$ to about 75° C. by the temperature controlling mechanism 22. The heater 40 heats each passage to about 80° C. to prevent the $TiCl_4$ gas from condensing to be converted into a liquid.

Figure 3:
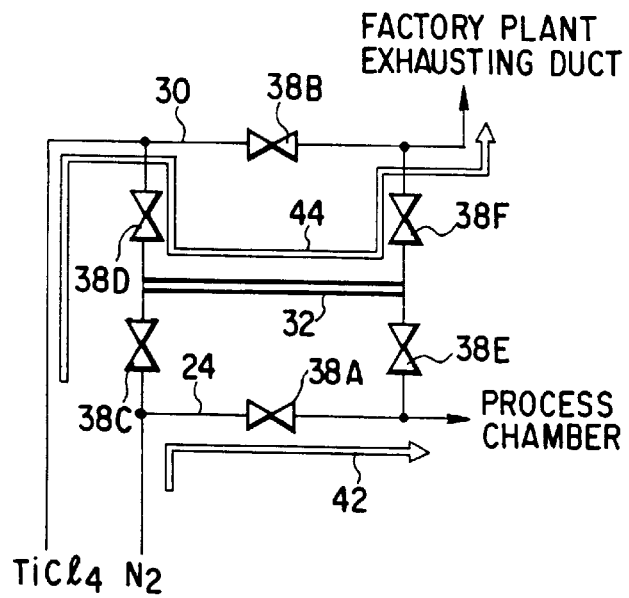
FIG. 3 is a diagram showing a gas-flow route in the process-gas supply apparatus of FIG. 1.
Figure 4:
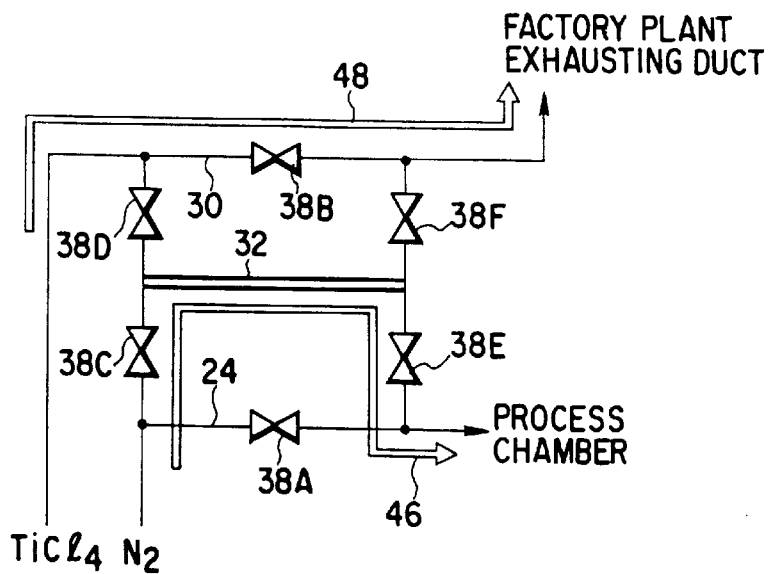
FIG. 4 is a diagram showing another gas-flow route in the process-gas supply apparatus of FIG. 1.

After the gas flows as shown in FIG. 3 and the measuring tube 32 is filled with 10 cc of $TiCl_4$ gas, the first, fourth, and sixth valves 38A, 38D, 38F are switched to closed positions; at the same time, the second, third, and fifth valves 38B, 38C, 38E are switched to open positions. All these switching operations are carried out simultaneously. Hence, the $N_2$ gas (serving as a carrier gas) supplied form the $N_2$ gas supply source 20 is introduced into the measuring tube 32 by way of the carrier gas path 24 and the third valve 38C and then flows into the process chamber 6 by way of the fifth valve 38E and the carrier gas path 24, as indicated by an arrow 46 in FIG. 4. At this time, the $TiCl_4$ gas stored in the measuring tube 32 is pushed by the carrier gas and flows into the process chamber 6. Whereas, the $TiCl_4$ gas supplied from the gas source 22 is directly exhausted to the exhaust duct of the factory plant by way of the gas exhaust path 30 without passing through the measuring tube 32, as indicated by an arrow 48 in FIG. 4.

In the process-gas supply apparatus 2 of this embodiment, a pressure sensor 60 (as shown in FIG. 1) for detecting the inner pressure of the measuring tube 32 may be arranged in order to confirm that the measuring tube 32 is completely filled with the $TiCl_4$ gas. In this case, upon detecting that the measuring tube 32 is completely filled with $TiCl_4$ gas by the pressure sensor 60, the detection signal is sent to the main controlling section 70. The main controlling section 70 switches the first, fourth and sixth valves 38A, 38D, 38F to closed positions; at the same time, the second, third, and fifth valves 38B, 38C, 38E to open positions. Alternatively, the third and fifth valves 38C, 38E may be constructed as a relief valve and these valves 38C, 38F may be opened at the time the measuring tube 32 is completely filled with the $TiCl_4$ gas.

As explained in the foregoing, in the process-gas supply apparatus 2 of this embodiment, the gas exhaust path 30 is allowed to communicate with the measuring tube 32 by means of the valve mechanism 38, thereby filling the measuring tube 32 with a constant amount of the process gas.

Thereafter, the measuring tube 32 is allowed to communicate with the carrier gas path 24 by means of the valve mechanism 38. As a result, the process gas stored in the measuring tube 32 is pushed by the carrier gas and supplied into the process chamber 6. In this way, the process gas can be supplied into the process chamber 6 accurately in a predetermined amount defined by the volume of the measuring tube 32. As a result, the film is accurately formed on the substrate W in a predetermined thickness which is defined by the gas supply amount.

If the flow amount of the process gas to be supplied is controlled accurately by using the corresponding measuring tube, the thickness of the film to be formed can be controlled accurately. In particular, if a small-volume measuring tube is used, the flow amount can be minutely controlled, with the result that very thin film can be formed accurately. Such a minute control cannot be attained by a conventionally-used mass-controller.

In the process-gas supply apparatus 2 of this embodiment, the inner pressures of the both paths 24, 30 are always controlled substantially equal. Therefore, pressure of the process chamber 6 does not change at the switchover time of the valves 38A to 38F. It is therefore possible to control the film thickness accurately without change in process conditions.

In the aforementioned embodiment, switchover operations of the valves 38A–38F are effected simultaneously. However, as long as the $TiCl_4$ gas stored in the measuring tube 32 is transported into the process chamber 6 without failure, the switchover operation is not limited to the method of the aforementioned embodiment. For example, the open-close state shown in FIG. 3 may be changed into that shown in FIG. 4 as follows: the fourth and sixth valves 38D, 38F are closed and the second valve 38B is opened, thereby isolating the $TiCl_4$ gas stored in the measuring tube 32 temporarily. Thereafter, the third and fifth valves 38C, 38E are opened, at the same time, the first valve 38A is closed.

In the aforementioned embodiment, when 30 cc of the $TiCl_4$ gas is required in order to form a film in a desired thickness, the measuring tube 32b of 30 cc shown in FIG. 2B may be used. Alternatively, the valve switchover operation may be repeated intermittently three times by using the measuring tube 32a of 10 cc shown in FIG. 2A, thereby supplying 30 cc of $TiCl_4$ gas to the process chamber 6, in total. In brief, according to the constitution of the aforementioned embodiment, in the case where the switchover operation is repeated intermittently appropriate times, the $TiCl_4$ gas can be supplied in a requisite flow amount as a whole. In the case where the film is formed by supplying the gas intermittently a plurality of times, it is considered that the film is stayed in the equivalent state as an annealing while the film formation gas is not supplied. As a result, the resistance of the film becomes low, improving the quality of the film.

Figure 5:
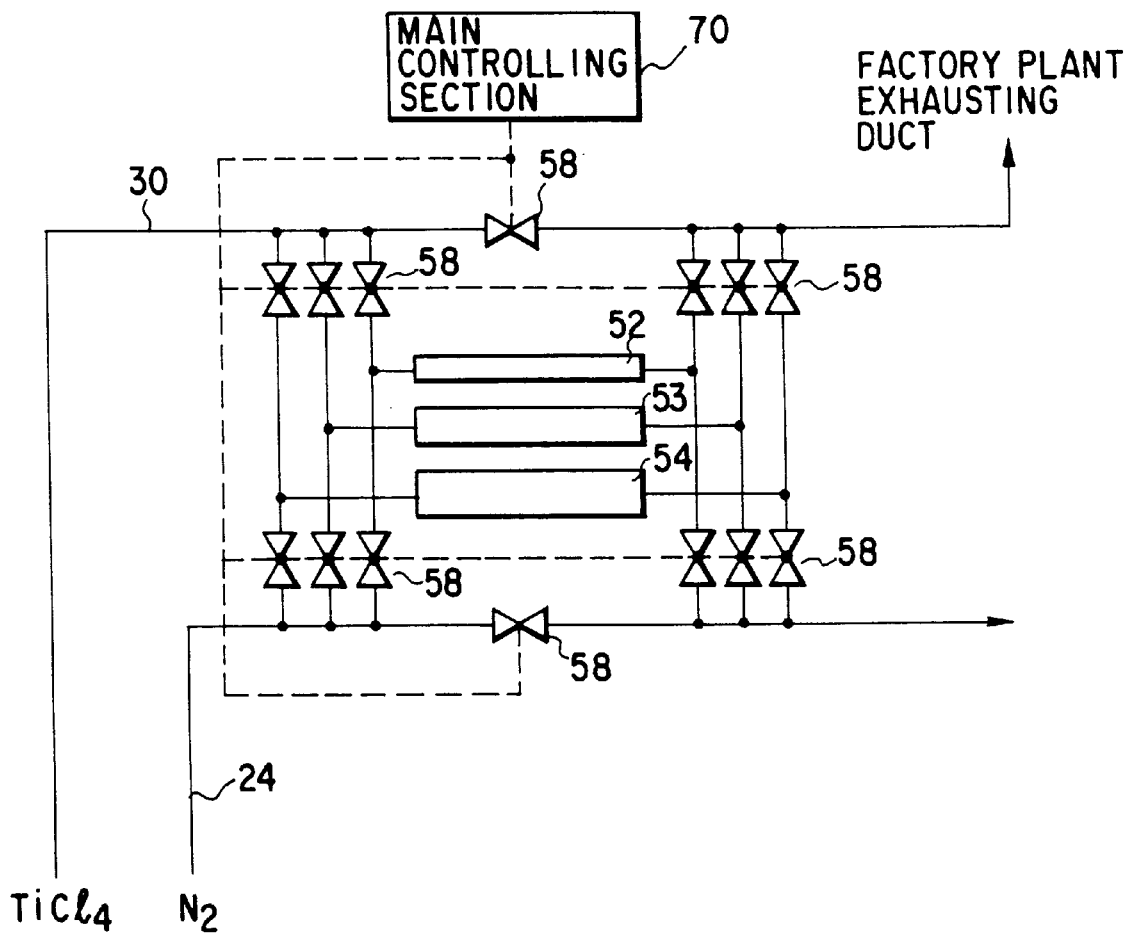
FIG. 5 is a circuit diagram showing another circuit constitution.

In another case where a plurality of measuring tubes 32 are connected in parallel and placed between the junctions A and B, the same effects can be obtained. Such a constitution is shown in FIG. 5. This apparatus includes a plurality of gas storing portions 52, 53, 54. The process gas can be selectively filled into or released from one or two or more of the gas storing portions, in a desired amount. The gas storing portions 52, 53, 54 are different in content and individually connected to a carrier gas pipe 24 and a process gas pipe 30 by way of the open/shut means 58 discretely provided.

The controlling section 70 controls the open/shut means 58 in the same manner as in the aforementioned embodiment, thereby filling the process gas into the gas storing portion(s) 52, 53, 54 arbitrarily chosen and sending the process gas therefrom to the process chamber 6.

If the contents of gas storing portions 52, 53, 54 are defined as 10, 20, 30 cc and if the gas storing portions are appropriately chosen alone or in combination, gas can be introduced into the process chamber accurately in an amount of 10, 20, 30, 40, 50, or 60 cc.

In the aforementioned embodiment, a $NH_3$ (ammonia) gas is supplied. If the gas supply system 18 is formed in the same construction as that of the process-gas supply apparatus 2, the $NH_3$ gas-flow, even in an small amount, can be controlled accurately. In the embodiment, a Ti film is formed on the substrate W. When a TiN film or a TiSi film is desired to form on the substrate W, a process gas source capable of generating a process gas required for the formation of the desired film, can be connected to the gas exhaust path 30 in place of the $TiCl_4$ gas source 22. The process-gas supply apparatus 2 of this embodiment is not necessary to be used in a single-processing semiconductor manufacturing apparatus and may be used in a batch-type semiconductor manufacturing apparatus capable of processing a plurality of substrates simultaneously. As examples of the substrate W to be processed in the process-gas supply apparatus 2 of the embodiment, a glass substrate and an LCD substrate other than the semiconductor wafer may be mentioned.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A process-gas supply apparatus for supplying a process gas to a process chamber in which a predetermined processing using the process gas is applied to the object set therein, which comprising:

a process-gas source for generating a process gas;

a carrier gas source filled with a carrier gas;

at least one gas storing section having a predetermined volume and to be filled with the process gas;

a carrier-gas introducing pipe connecting the carrier gas source to the process chamber to introduce the carrier gas from the carrier gas source to the process chamber;

a process-gas releasing pipe connected to the process-gas source;

a process-gas filling circuit having at least one pipe which connects the at least one gas storing section to the process-gas releasing pipe and is provided with at least one open/shut valve;

a process gas releasing circuit having at least one pipe which connects the gas storing section to the carrier-gas introducing pipe and is provided with at least one open/shut valve;

a controlling section for controlling not only a communication state between the process-gas releasing pipe and the gas storing section but also a communication state between the carrier-gas introducing pipe and the gas storing section, by switchover of the open/shut valves attached to the process-gas filling circuit and the process gas releasing circuit, wherein said controlling section allows the process-gas releasing pipe to communicate with the gas storing section to fill the gas storing section with the process gas flowing in the process-gas releasing pipe, in a volume defined by the predetermined content of the gas storing section; and thereafter allows the carrier-gas introducing pipe to communicate with the gas storing section to introduce the carrier gas flowing through the carrier-gas introducing pipe into the gas storing section, thereby releasing the process gas stored in the gas storing section toward a process chamber, under the guidance of the carrier gas.

2. The process-gas supply apparatus according to claim 1, wherein said process-gas filling circuit has a first connecting pipe connecting an upstream side of the process-gas releasing pipe to an end opening of the gas storing section, a second connecting pipe connecting a downstream side of the process-gas releasing pipe to the other end opening of the gas storing section, and open/shut valves respectively attached to the first and second connecting pipes;

said process gas releasing circuit has a third connecting pipe connecting an upstream side of the carrier-gas introducing pipe to an end opening of the gas storing section, a fourth connecting pipe connecting a downstream side of the carrier-gas introducing pipe and the other end opening of the gas storing section; and open/shut valves respectively provided at the third and fourth connecting pipes;

said process-gas releasing pipe having a single open/shut valve between two portions at which the process-gas releasing pipe is connected to the first and second connecting pipes; and said carrier-gas introducing pipe has a single open/shut valve between two portions at which the carrier-gas introducing pipe is connected to the third and fourth connecting pipes.

3. The process-gas supply apparatus according to claim 2, wherein said controlling section allows the gas storing section to be filled with the process gas flowing through the process-gas releasing pipe, in a predetermined amount defined by the volume of the gas storing section, by opening the open/shut valves respectively attached to the first and second connecting pipes, while the open/shut valves respectively attached to the third and fourth connecting pipes remain shut, and followed by introducing the carrier gas flowing through the carrier-gas introducing pipe into the gas storing section by shutting the open/shut valves respectively attached to the first and second connecting pipes and opening the open/shut valves respectively attached to the third and fourth connecting pipes, thereby releasing the process gas stored in the gas storing section toward the process chamber, under the guidance of the carrier gas.

4. The process-gas supply apparatus according to claim 3, wherein said controlling section shuts the open/shut valve attached to the process-gas releasing pipe and simultaneously opens the open/shut valve attached to the carrier-gas introducing pipe, while the gas storing section is being filled with the process gas from the process-gas releasing pipe; and said controlling section opens the open/shut valve attached to the process-gas releasing pipe, and simultaneously shuts the open/shut valve attached to the process-gas releasing pipe, while the process gas is being released from the gas storing section.

5. The process-gas supply apparatus according to claim 2, wherein the open/shut valves respectively attached to the third and fourth connecting pipes are relief valves, and each of said relief valves is opened when the gas storing section is filled with the process gas by the predetermined volume.

6. The process-gas supply apparatus according to claim 1, wherein a thin film is formed on the object by the process gas in said process chamber.

7. The process-gas supply apparatus according to claim 1, wherein said process-gas releasing pipe is connected to a discharging duct.

8. The process-gas supply apparatus according to claim 1, further comprising a detecting sensor for detecting an inner pressure of the gas storing section, wherein said controlling section controls the switchover of the open/shut valves respectively attached to the process-gas filling circuit and the process gas releasing circuit, on the basis of the detection data from the detection sensor.

9. The process-gas supply apparatus according to claim 1, wherein an inner pressure of the process-gas releasing pipe is set substantially the same as an inner pressure of the carrier-gas introducing pipe.

10. The process-gas supply apparatus according to claim 1, wherein said gas storing section is formed of a tube body having a predetermined inner diameter and length.

11. The process-gas supply apparatus according to claim 1, wherein an inner diameter of the gas storing section is set at a substantially equal to that of a pipe route constituting the process-gas filling circuit and the process gas releasing circuit.

12. The process-gas supply apparatus according to claim 1, wherein a plurality of the gas storing sections different in content are individually connected to the process gas releasing pipe and the carrier gas introducing pipe by way of the process gas filing circuit and the process gas releasing circuit;

said controlling section allows the process-gas releasing pipe to communicate selectively with at least one of the plurality of gas storing sections to fill the gas storing sections with the process gas flowing in the process-gas releasing pipe, in a volume defined by a predetermined content of each of the gas storing sections; and thereafter allows the carrier-gas introducing pipe to communicate with the gas storing section filled with the process gas to introduce the carrier gas flowing through the carrier-gas introducing pipe into the gas storing section, thereby releasing the process gas stored in the gas storing section toward a process chamber, under the guidance of the carrier gas.

\* \* \* \* \*